United States Patent
Gerhardinger et al.

(10) Patent No.: US 8,779,627 B2
(45) Date of Patent: Jul. 15, 2014

(54) GRID TIE SOLAR SYSTEM AND A METHOD

(75) Inventors: Peter F. Gerhardinger, Maumee, OH (US); David R. Feltner, Sylvania, OH (US); Richard L. Ashton, Perrysburg, OH (US); Robert J. Simons, Whitehouse, OH (US)

(73) Assignee: Nextronex, Inc., Millbury, OH (US)

( * ) Notice: Subject to any disclaimer, the term of this patent is extended or adjusted under 35 U.S.C. 154(b) by 229 days.

(21) Appl. No.: 12/752,254

(22) Filed: Apr. 1, 2010

(65) Prior Publication Data

US 2010/0253151 A1 Oct. 7, 2010

Related U.S. Application Data

(60) Provisional application No. 61/211,649, filed on Apr. 1, 2009, provisional application No. 61/267,192, filed on Dec. 7, 2009, provisional application No. 61/304,036, filed on Feb. 12, 2010.

(51) Int. Cl.
*H02J 1/00* (2006.01)
*H02J 3/38* (2006.01)
*H01L 31/02* (2006.01)
*G05F 1/67* (2006.01)

(52) U.S. Cl.
CPC .............. *H02J 3/383* (2013.01); *Y02E 10/58* (2013.01); *H01L 31/02021* (2013.01); *G05F 1/67* (2013.01); *Y02E 10/563* (2013.01); *H02J 3/385* (2013.01)
USPC ................ 307/82; 136/244; 363/95

(58) Field of Classification Search
CPC ....... H02J 1/02; Y02E 10/50; H02M 3/33507
USPC ............................................. 136/244; 363/95
See application file for complete search history.

(56) References Cited

U.S. PATENT DOCUMENTS

| | | |
|---|---|---|
| 3,922,639 A | 11/1975 | Shimahara et al. |
| 4,285,481 A | 8/1981 | Biscomb |
| 4,591,965 A | 5/1986 | Dickerson |
| 4,680,690 A | 7/1987 | Dickerson |
| 5,268,832 A | 12/1993 | Kandatsu |
| 5,289,998 A | 3/1994 | Bingley et al. |
| 5,329,172 A | 7/1994 | Kohdaka |
| 5,977,659 A | 11/1999 | Takehara et al. |
| 6,104,624 A * | 8/2000 | Iwamoto et al. ............ 363/71 |

(Continued)

FOREIGN PATENT DOCUMENTS

| | | |
|---|---|---|
| CN | 1669208 A | 9/2005 |
| CN | 101107442 A | 1/2008 |

*Primary Examiner* — Jared Fureman
*Assistant Examiner* — Alfonso Perez Borroto
(74) *Attorney, Agent, or Firm* — Fraser Clemens Martin & Miller LLC; Michael E. Dockins

(57) ABSTRACT

A grid tie system includes a plurality of solar panels, a plurality of inverters, wherein each of the inverters is in electrical communication with at least one of the solar panels to convert a direct current to an alternating current, wherein each of the inverters has an active state and an inactive state and at least one of the inverters includes a tracking component to track a maximum power point of at least one of the solar panels, and a controller in communication with at least one of the inverters for selectively toggling the at least one of the inverters between the active state and the inactive state.

17 Claims, 10 Drawing Sheets

(56) References Cited

U.S. PATENT DOCUMENTS

| | | | |
|---|---|---|---|
| 6,111,767 A | 8/2000 | Handleman | |
| 6,232,742 B1 | 5/2001 | Wacknov et al. | |
| 6,285,572 B1* | 9/2001 | Onizuka et al. | 363/72 |
| 6,646,196 B2 | 11/2003 | Fronek et al. | |
| 6,853,940 B2 | 2/2005 | Tuladhar | |
| D507,528 S | 7/2005 | Feldman et al. | |
| 7,031,176 B2 | 4/2006 | Kotsopoulos et al. | |
| 7,112,891 B2 | 9/2006 | Johnson et al. | |
| 7,129,592 B1 | 10/2006 | Yetter | |
| 7,193,872 B2 | 3/2007 | Siri | |
| 7,230,819 B2 | 6/2007 | Muchow et al. | |
| 7,274,975 B2 | 9/2007 | Miller | |
| 7,324,361 B2 | 1/2008 | Siri | |
| 7,999,418 B2* | 8/2011 | Wang et al. | 307/151 |
| 2003/0054793 A1 | 3/2003 | Manis et al. | |
| 2003/0111103 A1* | 6/2003 | Bower et al. | 136/244 |
| 2004/0147172 A1 | 7/2004 | Brown et al. | |
| 2004/0211546 A1 | 10/2004 | Sivilotti et al. | |
| 2004/0264225 A1* | 12/2004 | Bhavaraju et al. | 363/120 |
| 2005/0045224 A1 | 3/2005 | Lyden | |
| 2005/0281064 A1* | 12/2005 | Olsen et al. | 363/71 |
| 2006/0164065 A1 | 7/2006 | Hoouk et al. | |
| 2006/0185727 A1* | 8/2006 | Matan | 136/293 |
| 2007/0103108 A1 | 5/2007 | Capp et al. | |
| 2007/0219932 A1 | 9/2007 | Carroll et al. | |
| 2007/0221267 A1* | 9/2007 | Fornage | 136/244 |
| 2007/0252716 A1 | 11/2007 | Burger | |
| 2007/0279863 A1 | 12/2007 | Illerhaus | |
| 2008/0078436 A1 | 4/2008 | Nachamkin et al. | |
| 2008/0143188 A1 | 6/2008 | Adest et al. | |
| 2008/0143462 A1* | 6/2008 | Belisle et al. | 335/201 |
| 2008/0238195 A1* | 10/2008 | Shaver et al. | 307/18 |
| 2009/0146423 A1* | 6/2009 | Arinaga | 290/44 |
| 2009/0218888 A1* | 9/2009 | Lorhammer et al. | 307/82 |
| 2010/0091532 A1* | 4/2010 | Fornage | 363/95 |
| 2010/0283325 A1* | 11/2010 | Marcianesi et al. | 307/82 |
| 2011/0032099 A1* | 2/2011 | Giesler | 340/568.1 |

* cited by examiner

GRID TIE SOLAR SYSTEM AND A METHOD

CROSS-REFERENCE TO RELATED APPLICATION

The present application claims priority to the following: U.S. Provisional Application Ser. No. 61/211,649 filed Apr. 1, 2009; U.S. Provisional Application Ser. No. 61/267,192 filed Dec. 7, 2009; and U.S. Provisional Application Ser. No. 61/304,036 filed Feb. 12, 2010. Each of the foregoing Applications is incorporated by reference herein in its entirety.

FIELD OF THE INVENTION

The present invention relates generally to solar panels for generating electricity. More particularly, the invention is directed to a grid tie inverter system for tying an electrical current generated by a plurality of solar panels into an electrical grid system and a method for controlling the same.

BACKGROUND OF THE INVENTION

A photovoltaic (PV) array is a linked collection of solar panels (modules), which are made of multiple interconnected solar cells that convert light energy into direct electrical current (DC), via the photovoltaic effect. However, most commercial and residential applications of electricity require alternating electrical current (AC) that typically is provided by power generating facilities utilizing coal, nuclear material, or water. Upon generating the alternating current, the power generating facilities transmit the generated alternating current into an electrical grid system.

In order for most commercial and residential users to utilize the electricity generated by the solar panels, the direct current from the solar panels is typically transformed into alternating current. This is achieved by way of an electrical device known as an inverter, the output of which is subsequently tied to the electrical grid system. In turn, the alternating current is distributed via the electrical grid system to commercial and residential sites.

Currently, in the United States, a conventional solar panel string (for example, consisting of cadmium telluride (CdTe) or amorphous silicon) comprises six solar panels which are wired in series, where each such solar panel string inherently operates at a voltage of approximately 372 VDC with an operating current of 0.87 amps. A set of the series solar panel strings is then wired in parallel to form a row, where a set of the rows form the solar array that produces a desired total current.

In general, regarding electrical safety for the general public, exposure to the public is regulated by the National Electrical Code (NEC), where people are not to come in contact with voltages over 42 volts (V) (and facilities are not to have a voltage above 600 V. Hence, many components (e.g., wire, fuses, and switches) are rated for operation up to and including the 600 V limit.

On the other hand, the National Electrical Safety Code (NESC) regulates electrical generating and distributing facilities, wherein skilled workers in such facilities may be exposed to high voltages that can exceed 600 volts.

Although much work has been done to generate direct current by way of solar panels and then to invert the direct current to alternating current for tie-in to the electrical grid, the solar industry has been hindered by overall low power efficiency rates associated with converting sunlight energy into useable alternating current by inverters.

It would be desirable to develop a grid tie system for tying a solar array to an electrical grid and a method of controlling the grid tie system, wherein the system and method maximize a harvesting of energy under low light level conditions and a reliability of the system through selective activation of an inverter of the system.

SUMMARY OF THE INVENTION

Concordant and consistent with the present invention, a grid tie system for tying a solar array to an electric grid and a method of controlling the grid tie system, wherein the system and method maximize a harvesting of energy under low light level conditions and a reliability of the system through selective activation an inverter of the system, has surprisingly been discovered.

In one embodiment, a grid tie system comprises: a plurality of solar panels; a plurality of inverters, wherein each of the inverters is in electrical communication with at least one of the solar panels to convert a direct current to an alternating current, wherein each of the inverters has an active state and an inactive state and at least one of the inverters includes a tracking component to track a maximum power point of at least one of the solar panels; and a controller in communication with at least one of the inverters for selectively toggling the at least one of the inverters between the active state and the inactive state.

On another embodiment, a grid tie system comprises: a solar array including a plurality of panel strings in parallel electrical communication with each other, wherein each of the panel strings includes a plurality of solar panels; a direct current conduction bus in electrical communication with each of the series wired panel strings; a plurality of inverters in electrical communication with the direct current bus ring to receive a direct current generated by the solar array and to convert the direct current to an alternating current, wherein each of the inverters has an active state and an inactive state and at least one of the inverters tracks a maximum power point of at least one of the solar panels; a controller in communication with each of the inverters to receive a feedback signal from each of the inverters and toggle at least one of the inverters between the active state and the inactive state based upon an analysis of each of the feedback signals, wherein the feedback signal includes information about an operational characteristic of an associated one of the inverters.

The invention also includes methods of controlling a grid tie system.

One method comprises the steps of: providing a plurality of solar panels; providing a plurality of inverters, each of the inverters in electrical communication with at least one of the solar panels to receive a direct current therefrom and to convert the direct current to an alternating current, wherein each of the inverters has an active state and an inactive state and at least one of the inverters tracks a maximum power point of at least one of the solar panels; generating a feedback signal including information about an operational characteristic of at least one of the inverters; analyzing the feedback signal; and toggling at least one of the inverters between the active state and the inactive state in response to the analysis of the feedback signal.

BRIEF DESCRIPTION OF THE DRAWINGS

The above, as well as other advantages of the present invention, will become readily apparent to those skilled in the art from the following detailed description of the preferred embodiment when considered in the light of the accompanying drawings in which.

DETAILED DESCRIPTION OF EXEMPLARY EMBODIMENTS OF THE INVENTION

The following detailed description and appended drawings describe and illustrate various embodiments of the invention. The description and drawings serve to enable one skilled in the art to make and use the invention, and are not intended to limit the scope of the invention in any manner. In respect of the methods disclosed, the steps presented are exemplary in nature, and thus, the order of the steps is not necessary or critical.

FIGS. 1A-1C and 2 illustrate a grid tie system 10 (also known as a grid tie solar system or grid tie photovoltaic (PV) system) for harvesting solar energy according to an embodiment of the present invention. As shown, the system 10 includes two portions 12a, 12b, each of which includes a plurality of rows 14, wherein the rows 14 are collectively referred to as a solar array. As a non-limiting example, each row 14 includes a plurality of series strings 16.

Figure 2:
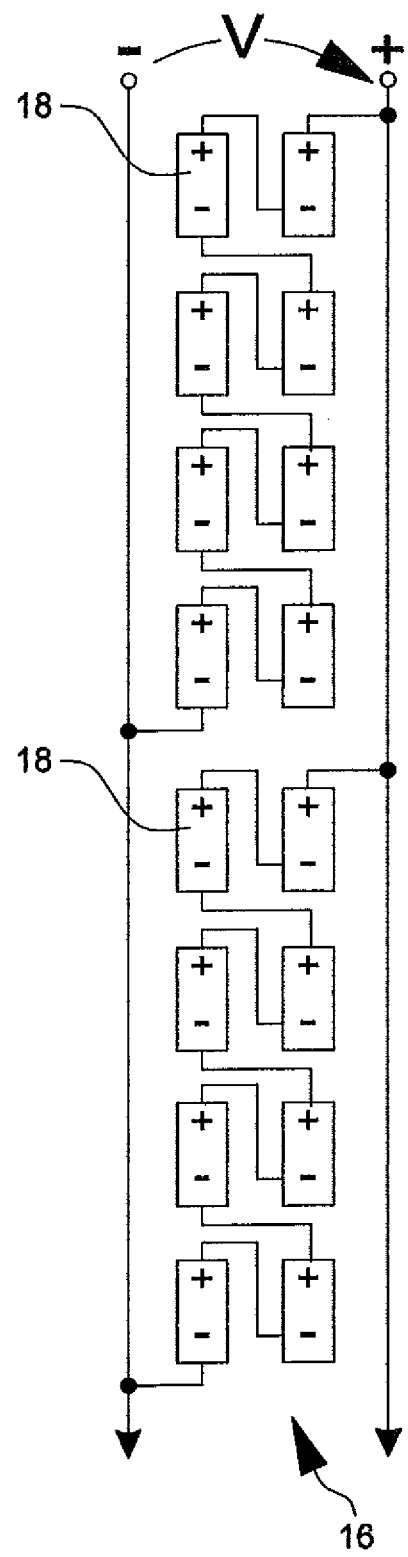
FIG. 2 is a schematic representation of a series string of the grid tie system of FIGS. 1A-1C.

As more clearly shown in FIG. 2, each of the strings 16 includes a plurality of solar panels 18 that are wired together in series. The strings 16 making up each of the rows 14 are wired together in parallel. In certain embodiments, each of the strings 16 includes six of the solar panels 18 wired in series to operate at approximately a voltage of 372 VDC, an operating current of 0.87 amps, and an open circuit voltage of 500 VDC. In certain embodiments, each of the strings 16 includes eight of the solar panels 18 wired in series to operate at approximately a voltage of 496 VDC, an operating current of 1.16 amps, and an open circuit voltage of 672 VDC. In certain embodiments, each of the strings 16 includes ten of the solar panels 18 to operate at approximately a voltage of 620 VDC, a current of 2.03 amps, and at an open circuit voltage of 840 VDC. It is understood that any number of the strings 16 and the panels 18 can be used to form a solar array.

As a non-limiting example, each of the portions 12a, 12b includes forty-four of the rows 14, each of the rows 14 includes twenty of the strings 16, and each of the strings 16 includes eight of the solar panels 18. Accordingly, the system 10 includes eighty-eight of the rows 14, wherein each of the rows 14 includes one hundred and sixty of the panels 18. However, unless expressed otherwise, the present invention is not limited by the number or configuration of the array portions 12a, 12b, the rows 14, the strings 16, or the panels 18.

The system 10 further includes a direct current conduction bus 20 (DC bus) in electrical communication with each of the strings 16, a plurality of inverters 22 in electrical communication with the DC bus 20, wherein each of the inverters 22 has an active state and an inactive state, an alternating current conduction bus 24 (AC bus) in electrical communication with each of the inverters 22; an electrical transformer 26 in communication with the AC bus 24 to receive an alternating current therefrom and step up the AC output voltage to match the distribution lines of an AC grid 28, and a controller 30 in communication with at least one of the inverters 22 for selectively toggling the at least one of the inverters 22 between the active state and the inactive state.

Figure 1A:
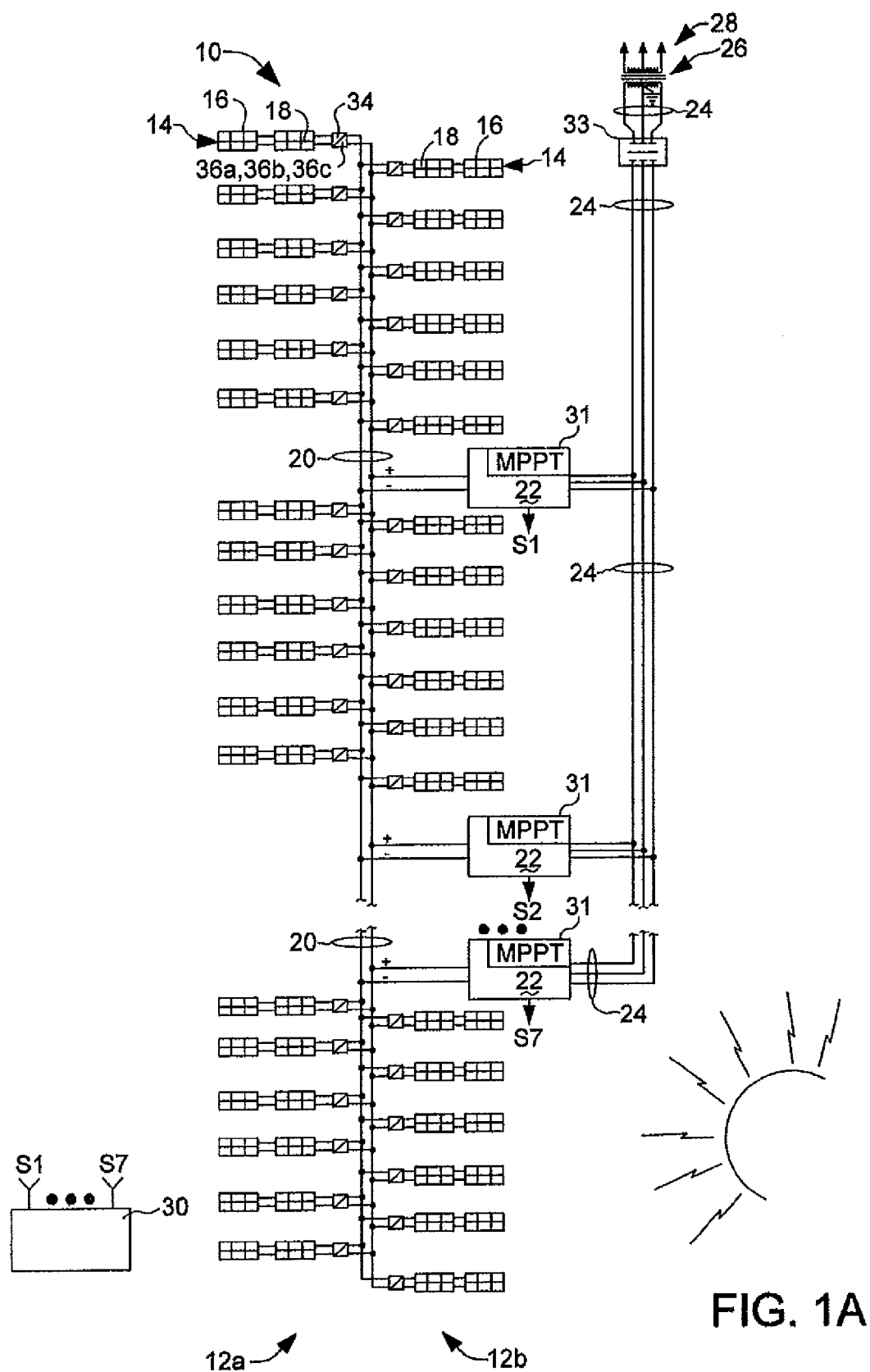
FIG. 1A is a schematic representation of a grid tie system according to an embodiment of the present invention.
Figure 1B:
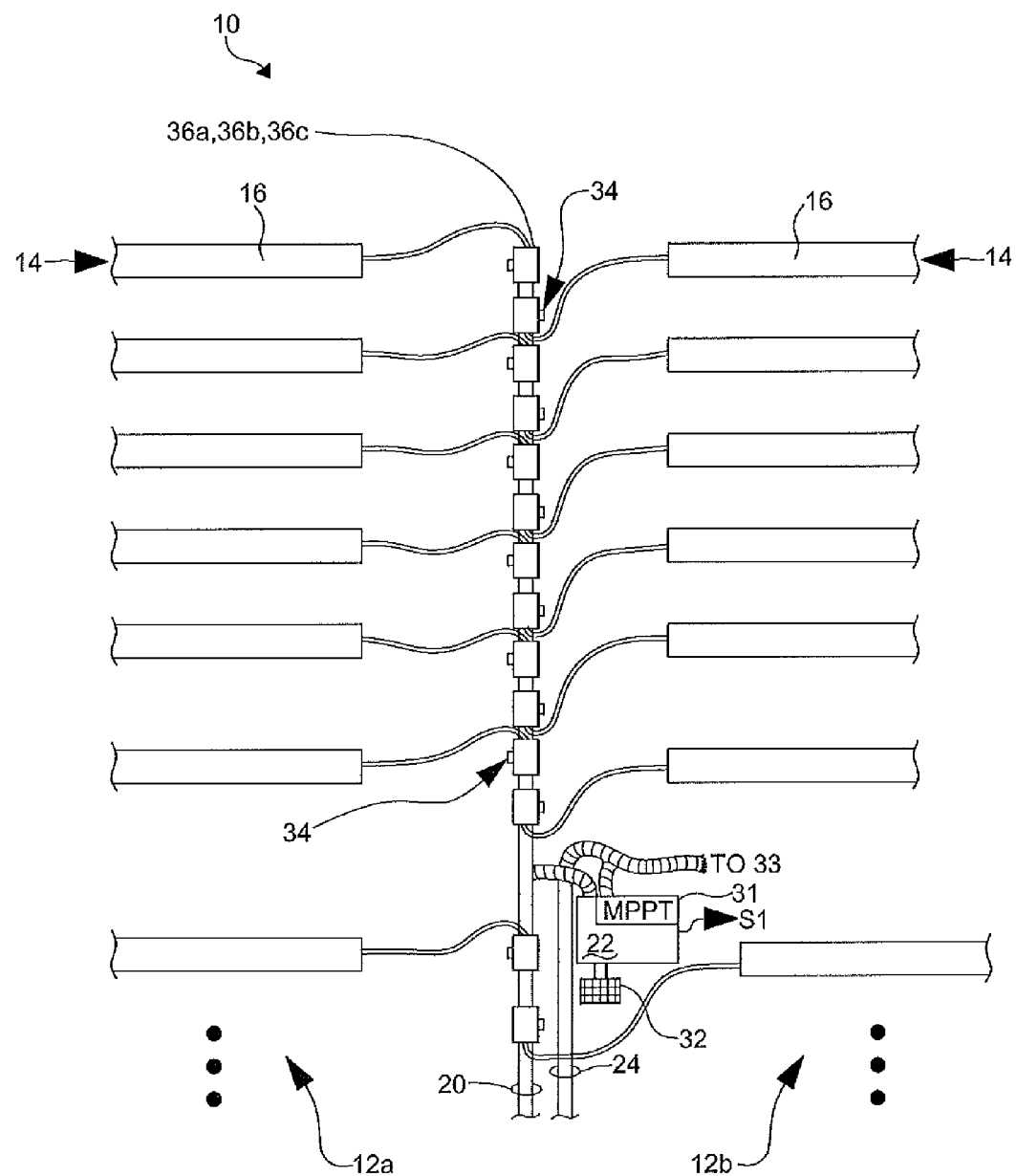
FIG. 1B is a top plan view of the grid tie system of FIG. 1A.
Figure 1C:
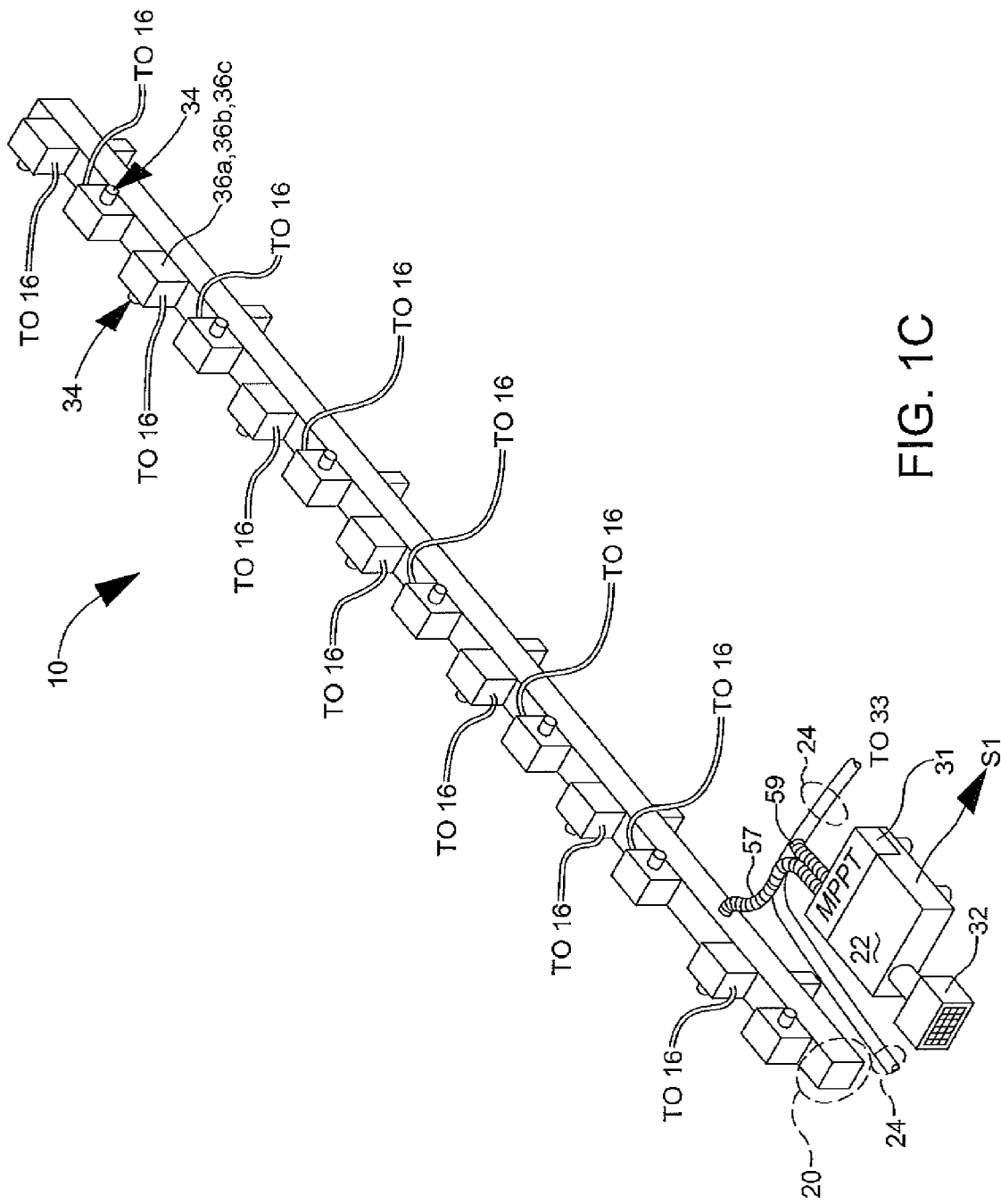
FIG. 1C is a perspective view of the grid tie system of FIG. 1A.

In the embodiment shown in FIGS. 1A-1C, the DC bus 20 is substantially linear. However, other configurations such as a ring shape can be used. Each of the rows 14 is electrically connected to the DC bus 20 in a parallel configuration to transmit a DC current therethrough. However, other electrical configurations can be used.

The inverters 22 are electrically coupled to the DC bus 20 to receive a DC current (input) and convert the DC current into an output AC current, wherein the AC current is transmitted to the AC bus 24. In certain embodiments, the direct wiring connection 57 from the DC bus 20 to a DC input of each of the inverters 22 is no more than ten feet (three meters) and the direct wiring from the output of each of the inverters 22 to the AC bus 24 is by way of a "pig tail" cable 59 of approximately ten feet. However, any configuration using any length of wiring between the inverters 22, the DC bus 20, and the AC bus 24, can be used.

As a non-limiting example, at least one of the inverters 22 includes a maximum power point tracker (MPPT) 31 to track a maximum power point of at least one of the solar panels 18. It is understood that the MPPT 31 can be any type of control circuit, device, or logic to adjust the settings of the inverter to search for a maximum power point and allow the at least one of the inverters 22 to extract the maximum power available from an associated device (i.e. the row 14, the string 16, the panel 18, etc.).

The inverters 22 are utilized on an as-needed basis to convert the DC input and transmit an output power. Any number of the inverters 22 are selectively toggled between an active state and an inactive state by the controller 30 (e.g. programmable logic controller (PLC)). As a non-limiting example, the controller 30 is in signal communication with each of the inverters 22 by way of one or more RS485 serial communications protocol connectors (S1-S7). Other connectors and protocols can be used. As a further non-limiting example, each of the inverters 22 includes an air inlet 32 for thermal management.

The AC bus 24 is substantially linear. However, other configurations can be used. Each of the inverters 22 is electrically connected to the AC bus 24 in a parallel configuration to transmit an AC current therethrough. However, other electrical configurations can be used.

The AC bus 24 includes a contactor/disconnect 33 that conducts the AC current to the transformer 26. It is understood that other switches and relays can be used to conduct the AC current to the transformer 26. The transformer 26 steps up an input voltage so that an AC output voltage matches the distribution lines of the AC grid 28. In addition, the transformer 26 galvanically isolates the inverters 22 from the electrical AC grid 28, which provides protection against islanding. Although the embodiment shown in FIGS. 1A-1C includes one of the transformers 26, it is understood that any number of the transformers 26 can be used. It is further understood that the transformer 26 can be electrically integrated in any position in the system 10 (e.g. load side).

As a non-limiting example, a plurality of disconnect boxes 34 and a plurality of clamping circuits 36a, 36b, 36c are disposed between the rows 14 and the DC bus 20. Specifically, each of the disconnect boxes 34 is disposed between at least one of the clamping circuits 36a, 36b, 36c and the DC bus 20. It is understood that any number of disconnect boxes 34 can be used.

Figure 3:
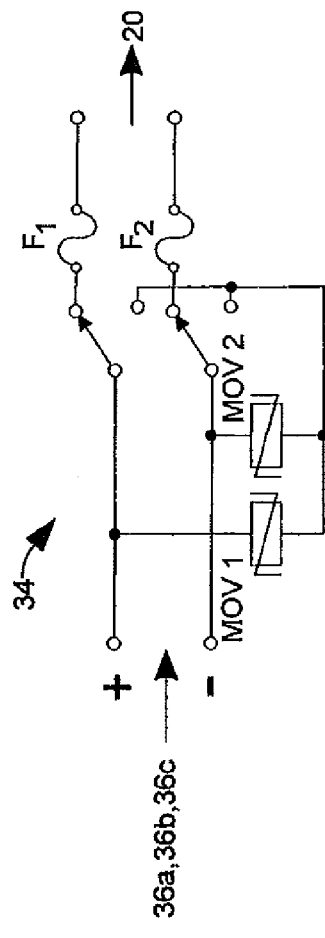
FIG. 3 is a schematic representation of a disconnect box of the grid tie system of FIGS. 1A-1C.

As more clearly shown in FIG. 3, each of the disconnect boxes 34 includes a double-pole, double-throw switch 38 interposed between the clamping circuit 36a, 36b, 36c and the DC bus 20. Each of the disconnect boxes 34 includes a plurality of protection devices. As a non-limiting example, the disconnect boxes 34 provide over-current protection by way of a plurality of fuses $F_1$, $F_2$ and lightning protection is provided by way of a plurality of metal oxide varistors MOV1, MOV2. It is understood that the placement of the disconnect boxes 34 at an output of each of the rows 14 minimizes the need to dispose fuses in each of the series strings 16, as conventional solar arrays require. It is further understood that the disconnect boxes 34 allow any row 14 to be disconnected from the DC bus ring 20 for service or maintenance at any time.

At least one of the clamping circuits 36a, 36b, 36c may be disposed between the rows 14 and the DC bus 20 to militate against a voltage of greater than 600 VDC being placed across the components within the solar panels 18 (e.g. a situation when the AC grid 28 "goes down" in the middle of a sunny day). In general, voltage clamping can be initiated manually, for example, in order to perform maintenance on an individual one of the rows 14 or when one or more of the rows 14 is/are not producing enough DC output. Also, clamping could be automatically commanded by, for example, the controller 30. It is understood that the clamping circuits 36a, 36b, 36c may be configured to clamp the voltage to any pre-determined voltage such as 600VDC and 1000 VDC, for example.

Figure 4:
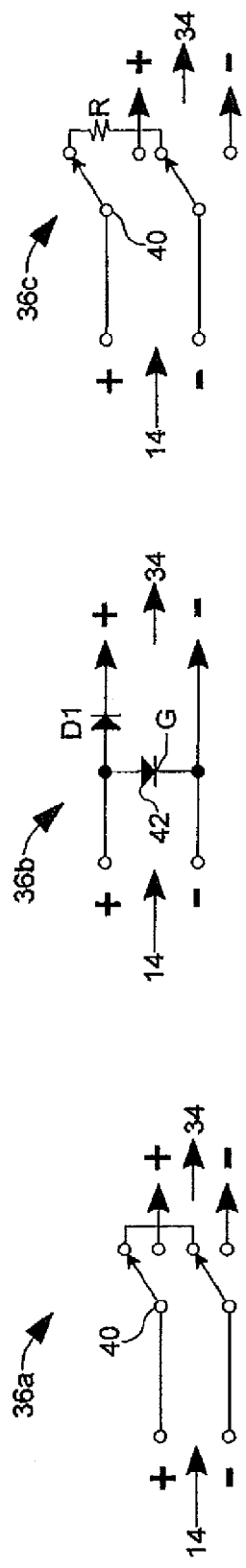
FIG. 4 is a schematic representation of a first clamping circuit of the grid tie system of FIGS. 1A-1C.

FIG. 4 illustrates the first clamping circuit 36a including a double-pole, double-throw switch 40. In a shorting position, the contacts of a double-pole, double-throw switch 40 short an incoming positive terminal from the output of an associated one of the rows 14 to an incoming negative terminal to place the associated one of the rows 14 in a short circuit condition. The short circuit condition protects the overall circuitry of the panels 18 from an overvoltage condition, for example. Subsequently, when the associated one of the rows 14 is to be brought back "on-line", a controlling signal is received (either electrically from the controller 30 or by mechanical means) to toggle the switch 40 to allow the DC output current of the row 14 to flow to the DC bus 20 via one of the disconnect boxes 34.

Figure 5:
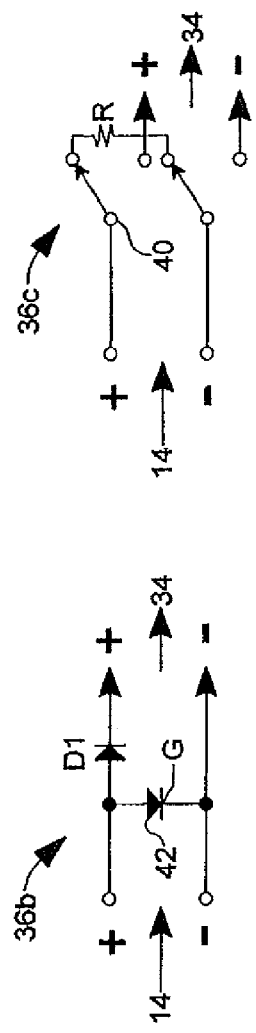
FIG. 5 is a schematic representation of a second clamping circuit of the grid tie system of FIGS. 1A-1C.

FIG. 5 illustrates the second clamping circuit 36b including a gate-turn-off (GTO) thyristor 42 that is sized appropriately for the magnitude of the DC current Iop being generated by one of the rows 14. With a controlling signal (e.g. from the controller 30) on a gate G of the thyristor 42, the output of the row 14 is short circuited as described above for the first clamp circuit 34a but with a 1 to 3 VDC drop across the thyristor 42. Conversely, if a control signal is not present on the gate G, the DC current output of the row 14 is presented to the input of an associated one of the disconnect box 38. When the thyristor 42 is conducting, a diode D1 prevents a short circuit of the entire system 10 by way of a DC bus ring 20, whereby the thyristor 42 would likely be damaged.

Figure 6:
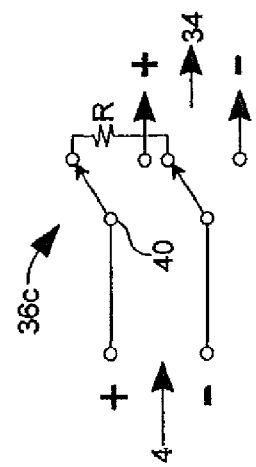
FIG. 6 is a schematic representation of a third clamping circuit of the grid tie system of FIGS. 1A-1C.

FIG. 6 illustrates a third clamping circuit 34c including a double-pole, double-throw switch 44 much like that of switch 40. However, instead of directly short circuiting the positive terminal of the incoming output of an associated one of the rows 14 to the incoming negative terminal, the third clamping circuit 36c includes a resistor R disposed therebetween. Hence, the third clamping circuit 36c functions similarly to that of the first clamping circuit 36a but presents a voltage drop across the resistor R in order to limit a current that would flow therethrough. Subsequently, if a controlling signal is received (e.g. from the controller 30 or by mechanical means) the contacts of the double-pole, double-throw switch 44 present the DC current output of the row 14 to the input of a disconnect box 34.

Although it seems counter intuitive, when disconnecting one of the rows 14 from supplying current to the system 10, it is better to cause the solar panels 18 to be short circuited rather than to be open circuited. Hence, the clamping of, for example, one of the rows 14 of the strings 16 minimizes the risk that the strings 16 experience a voltage that is greater than 600 VDC when the strings 16 are experiencing an open circuit condition, which is covered under the NEC.

However, in a fully secured solar array where only skilled utility workers have access, maintaining the maximum voltage of 600 VDC is not required. In this case, NESC standards apply. Also, in other locations around the world (for example, in Europe), solar arrays may have higher voltage levels, for example, up to 1000 VDC. Hence, voltage clamping may not be necessary, depending on the material composition of the solar cell and its tolerance to the larger voltages.

In use, the system 10 generates a DC current that is transmitted via the disconnect boxes 34 and clamping circuits 36a, 36b, 36c to the inverters 22. The inverters 22 convert the DC current to an output AC current which is transmitted to the transformer 26 via the AC bus 24. The transformer 26 provides galvanic isolation and voltage step-up (from a nominal 360 V AC to the distribution voltage, typically 12,500 V AC) for the received output of the inverters 22. In certain embodiments, the transformer 26 provides separate impedance balanced primary windings for each of the inverters 22.

It is understood that the cumulative operating current from each of the disconnect boxes 34 is conducted, via the DC bus 20, to the inverters 22 that are toggled to an "active" state. Specifically, the controller 30 determines a path that the DC output currents by cooperating with the inverters 22 to pass information back and forth to selectively determine which of the inverters 22 are to be turned on and off. The controller 30 effectively directs the DC current to a select number of the inverters 22 for transforming the DC current to AC current to maximize the power output of the system 10 and to reduce power losses within the system 10. The inverters 22 that are toggled to an "inactive" state are typically disconnected from the AC bus 24 and the AC grid 28 to minimize quiescent losses, thereby maximizing an efficiency of the grid tie system 10.

Figure 7:
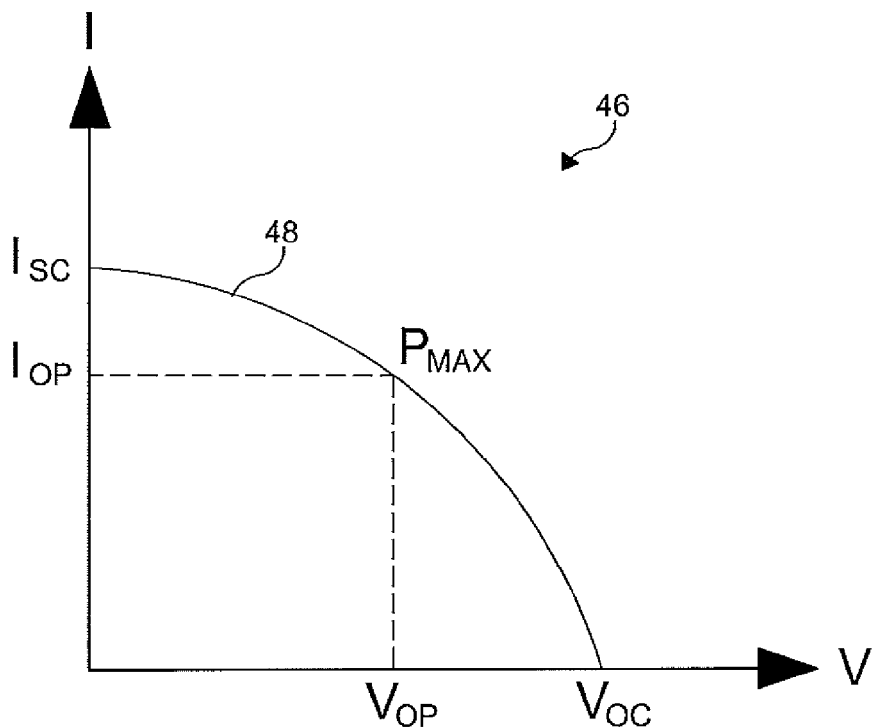
FIG. 7 is a graphical representation of electrical characteristics of a solar panel during a "one sun" illumination.
Figure 8:
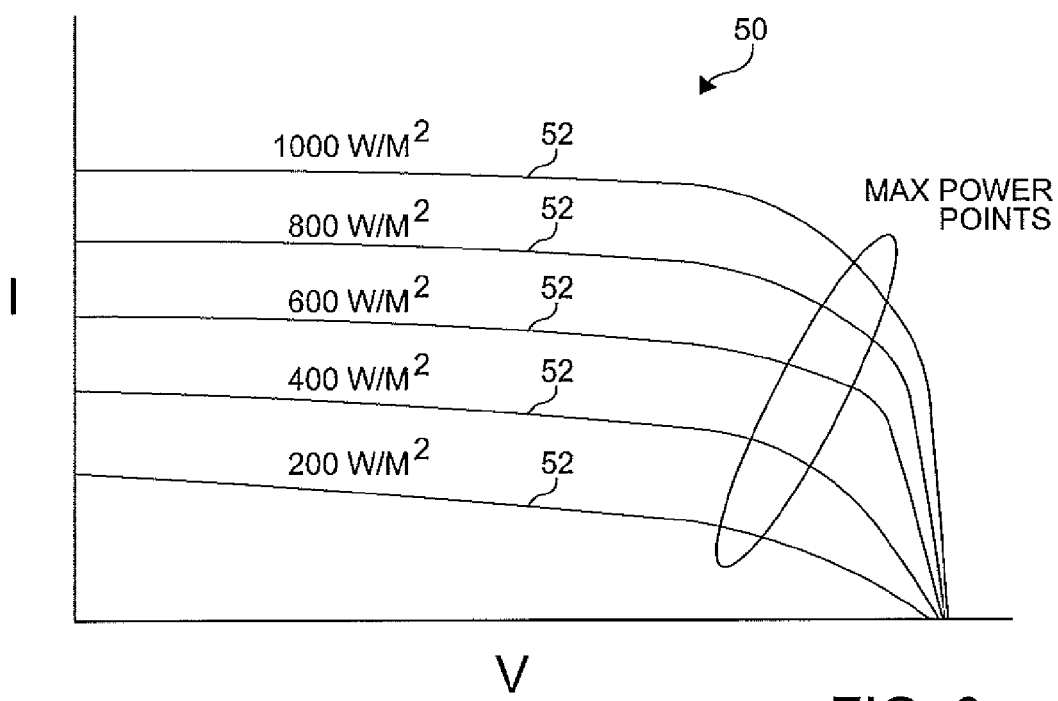
FIG. 8 is a graphical representation of electrical characteristics of a solar panel during a varying illumination.

FIGS. 7-8 illustrate a characteristic curve 46 of typical electrical characteristics of one of the solar panels 18, wherein I is current, V is voltage, $I_{sc}$ is short circuit current, $I_{op}$ is operation current, $V_{op}$ is operational voltage, $V_{oc}$ is open circuit voltage, and $P_{max}$ is a maximum power point. In particular, FIG. 7 shows an IV (Current/Voltage) curve 48 of one of the solar panels 18 under "One Sun" illumination (i.e. the standard under which conventional solar panels are rated.) It is understood that there is only one point (i.e. the maximum power point) on the IV curve where the product of voltage and current (i.e. power) is maximized. As a non-limiting example, the operating voltage ($V_{op}$) is about 20% less than the open-circuit voltage ($V_{oc}$).

FIG. 8 illustrates a graphical representation 50 of the same one of the solar panels 18 represented in FIG. 7 under varying illumination. The current varies in direct proportion to the solar level. However, the open circuit voltage remains constant. Each of a plurality of IV curves 52 has one point where the product of voltage and current is maximized (i.e. maximum power point).

When brought on-line, the inverters 22 utilize distributed control to calculate an individual maximum power point (MPP) based upon a DC power received from an associated number of the strings 16. For example, the inverters 22 are controlled based upon a traditional "perturb and observe" algorithm. When the DC power output of a connected number of the series strings 16 exceeds the collective capacity of the inverters 22 that are connected at a particular time, then the controller 30 toggles more of the inverters 22 to an "active" state. In turn, each of the inverters 22 that is toggled to an "Active" state determines an individual MPP that is utilized by that particular one of the inverters 22, while leaving the other ones of the inverters 22 that are already online at essentially their maximum current point Imax. In this way, the last of the inverters 22 on-line is regulating the operating voltage of the system 10 (via the DC bus 20), while the remaining inverters 22 continue to invert the maximum current from their respective portion of the DC bus 20. As a result, each of the inverters 22 determines and safely handles its own current at any given time, while minimizing resistive losses of the incoming current. In addition, each of the inverter 22 provides its own anti-islanding protection.

Figure 9:
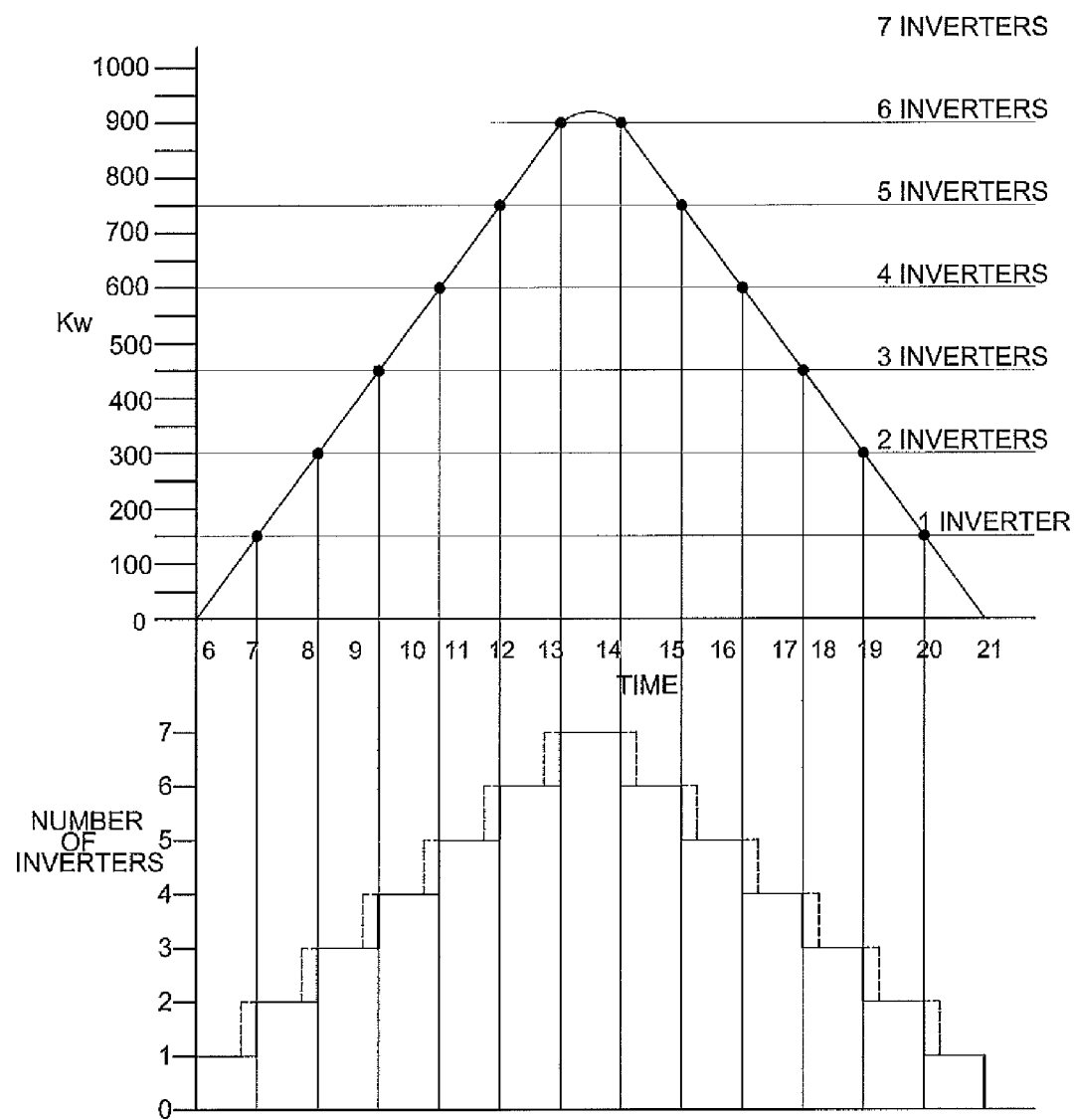
FIG. 9 is a graphical representation of electrical characteristics of the grid tie system of FIGS. 1A-1C, showing a dynamic toggling of a plurality of inverters.

As an illustrative example, FIG. 9 shows a depiction of a dynamic toggling of the inverters 22 based on a summer day in Toledo, Ohio. A plurality of dashed lines represent an 85% power level for each of the inverters 22, wherein at least a pair of the inverters 22 share a load proportionally. As the DC power output of the collective rows 14 varies throughout the day, any number of the inverters 22 can be toggled between the "active" and "inactive" state to share the load.

Compared to conventional solar arrays, which have inverters directly wired to individual rows, the DC bus 20 allows for any combination of the inverters 22 to be utilized in a virtually equal manner for inverting the collective DC output current of the rows 14 into an AC current that is conducted to the AC bus 24. It is understood that a major benefit of the present invention is the transmission of a lower electrical current at a higher voltage, thereby minimizing a gage of required wiring and connecting devices, which consequently minimizes construction and maintenance costs.

As a non-limiting example, the strings 16 include CdTe series-wired solar panels 18 (e.g. manufactured by First Solar, Incorporated of Phoenix, Ariz.) and have a nominal operation voltage on the order of 496 VDC to produce power on the order of 575 W. Where each row 14 includes twenty of the strings 16, wherein each of the strings 16 includes eight panels 18 wired in series to generate a current on the order of 23 A DC and 11.5 KW of power. Hence, the transformer 26 would be presented with a voltage of 360 VAC—three phase, which is transformed on the utility side (i.e., on the side of the grid 28) of the transformer 26 to 12,470 V/7,200 V—three phase. It is understood that the output of the system 10 is in contrast to the conventional six panel wired in series that would present 277 VAC—three phase.

As a further example, where each of the strings 16 includes ten of the panels 18, the nominal operational voltage would be in the order of 620 VDC which would produce power in the order of 719 W. Where each row 14 includes sixteen of the series strings 16 an output current in on the order of 18.6A DC and 11.5 KW of power. The transformer 26 would be presented with a voltage of 480 VAC—three phase, which is transformed on the utility side (the grid 28) of the transformer 26 to the 12,470 V/7,200 V—three phase.

Although the above specific examples are directed to CdTe series strings 16, the same trends and limits noted would exist for any type of solar panels 18 wired in series/parallel strings 16, 16', for example, amorphous silicon panels.

Figure 10:
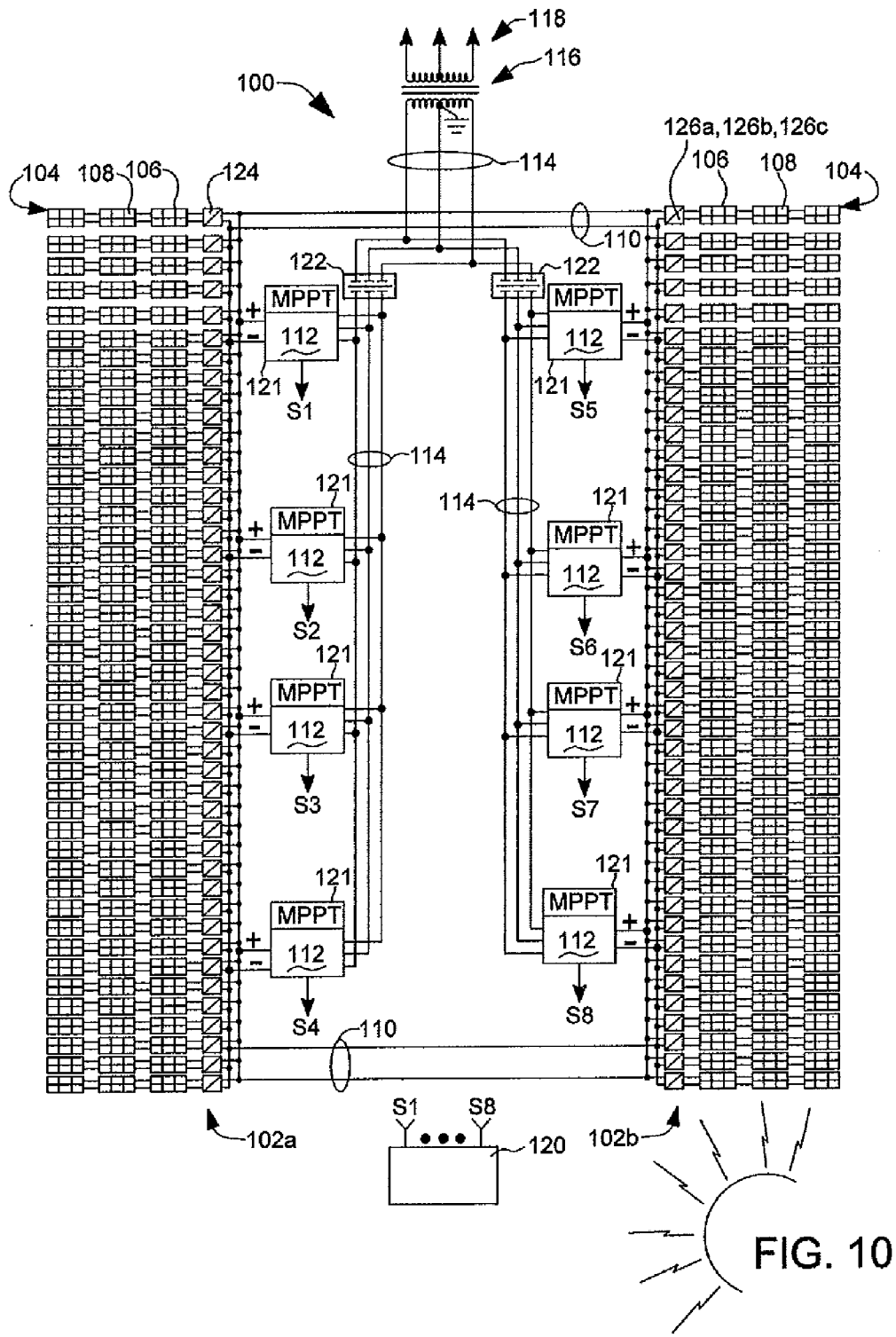
FIG. 10 is a schematic representation of a grid tie system according to another embodiment of the present invention.

FIG. 10 illustrates a grid tie system 100, also known as a grid tie solar system or grid tie photovoltaic (PV) system, according to another embodiment of the present invention similar to the system 10, except as described herein below. As shown, the system 100 includes two portions 102a, 102b each of which includes a plurality of rows 104. As a non-limiting example, each of the rows 104 includes a plurality of series strings 106. Each of the strings 106 includes a plurality of solar panels 108 that are wired together in series. The strings 106 making up each of the rows 104 are wired together in parallel. It is understood that any number of stings 106 and panels 108 can be used to form a solar array.

The solar array 100 further includes a direct current conduction bus 110 (DC bus) in electrical communication with each of the series wired panel strings 106, a plurality of inverters 112 disposed adjacent the DC bus 110 and electrically coupled thereto, wherein each of the inverters 112 has an active state and an inactive state, an alternating current conduction bus 114 (AC bus) in electrical communication with each of the inverters 112; an electrical transformer 116 in communication with the AC bus 114 to receive an alternating current therefrom and step up the AC output voltage to match the distribution lines of an AC grid 118, and a controller 120 in communication with at least one of the inverters 112 for selectively toggling the at least one of the inverters 112 between the active state and the inactive state.

The DC bus 110 is substantially ring shaped. However, other configurations such as a horseshoe shape can be used. Each of the rows 104 is electrically connected to the DC bus 110 in a parallel configuration to transmit a DC current therethrough. However, other electrical configurations can be used.

The inverters 112 are electrically coupled to the DC bus 110 to receive a DC current (input) and convert the DC current into an output AC current. As a non-limiting example, at least one of the inverters 112 includes a maximum power point tracker (MPPT) 121 to track a maximum power point of at least one of the solar panels 108. It is understood that the MPPT 121 can be any type of control circuit or logic to search for a maximum power point and allow the at least one of the inverters 112 to extract the maximum power available from an associated device (i.e. the row 104, the string 106, the panel 108, etc.).

The inverters 112 are utilized on an as-needed basis to convert the DC input and transmit an output power. In certain embodiments, any number of the inverters 112 are selectively toggled between an active state and an inactive state by the controller 120 (e.g. programmable logic controller (PLC)). As a non-limiting example, the controller 120 is in signal communication with each of the inverters 112 by way of RS485 serial communications protocol connectors (S1-S8).

Other connectors and protocols can be used. It is understood that by centrally locating the inverters 112 within the ring of the DC bus 110, a wire gauge used for interconnection between the inverters 112 and the DC bus 110 is minimized.

The AC bus 114 is substantially horseshoe shaped. However, other configurations such as a ring shape can be used. Each of the inverters 112 is electrically connected to the AC bus 114 in a parallel configuration to transmit an AC current therethrough. However, other electrical configurations can be used.

The AC bus 114 includes a contactor/disconnect 122 that conducts the AC current to the transformer 116. It is understood that other switches and relays can be used to conduct the DC current to the transformer 116. The transformer 116 steps up an input voltage so that an AC output voltage matches the distribution lines of the AC grid 118. Instead of multiple transformers (i.e., one transformer on the output of each of the conventional inverters), as conventional solar arrays require, the single large utility scale transformer 116 steps up the AC output voltage to match the distribution lines of the AC grid 118. In addition, the single transformer 116 galvanically isolates the inverters 112 from the electrical AC grid 118, which provides protection against islanding.

As a non-limiting example, a plurality of disconnect boxes 124 and a plurality of clamping circuits 126a, 126b, 126c are disposed between the rows 104 and the DC bus 110. Specifically, each of the disconnect boxes 124 is disposed between at least one of the clamping circuits 126a, 126b, 126c and the DC bus 110. It is understood that any number of disconnect boxes 124 can be used. It is understood that the placement of the disconnect boxes 124 at an output of each of the rows 104 minimizes the need to dispose fuses in each of the series strings 106, as conventional solar arrays require. It is further understood that the disconnect boxes 124 allow any row 104 to be disconnected from the DC bus ring 110 for service or maintenance at any time.

The clamping circuits 124a, 124b, 124c may be disposed between the rows 104 and the DC bus 110 to militate against a open circuit voltage of greater than 600 VDC being placed across the components within the solar panels 108 such as a situation when the AC grid 118 were to "go down" in the middle of a sunny day. In general, voltage clamping can be initiated manually, for example, in order to perform maintenance on an individual row or when one of the rows 104 is not producing enough DC output. Also, clamping could be automatically commanded by, for example, the controller 120. In certain embodiments, a disconnect box is dispose between the clamping circuit 124a, 124b, 124c and the DC bus 110.

In use, the solar panels 108 generate a DC voltage in response to exposure to solar energy. At least one of the inverters 112 senses the presence of the generated DC voltage and draws an electrical current which causes the DC voltage of at least one of the solar panels 108 to drop. On a very fast timeline (e.g. every two seconds) the at least one inverter 112 executes a "perturb and observe" routine to locate a maximum power point of at least one of the solar panels 108. It is understood that the "perturb and observe" routine may include varying a voltage and measuring a change in a resultant current. It is further understood that any "perturb and observe" routine or algorithm can be used. Once the maximum power point is determined, the at least one of the inverters 112 "locks" onto the maximum power point by maintaining the voltage-to-current ratio, conventionally referred to as maximum power point tracking. The inverters 112 convert the DC current to an output AC current which is transmitted to the transformer 112. The transformer 116 provides galvanic isolation and voltage step-up (from a nominal 360 V AC to the distribution voltage, typically 12,500 V AC) for the received output of the inverters 112. In certain embodiments, the transformer 116 provides separate impedance balanced primary windings for each of the inverters 112.

Figure 11:
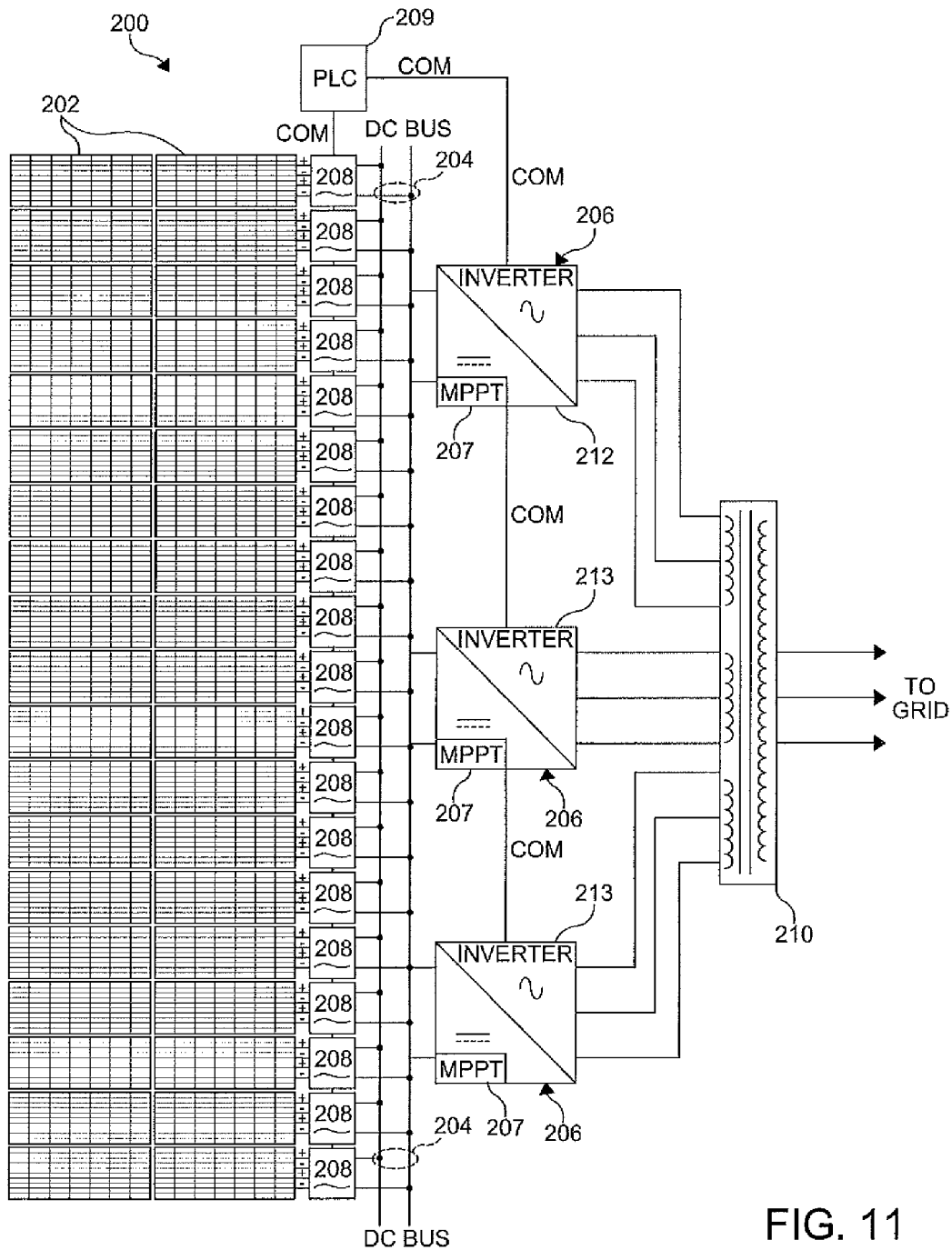
FIG. 11 is a schematic representation of a grid tie system according to another embodiment of the present invention.

FIG. 11 illustrates a solar array 200, also known as a grid tie solar system or grid tie photovoltaic (PV) system, according to another embodiment of the present invention similar to the grid tie system 10. The grid tie system 200 includes a plurality of solar panels 202 (e.g. arranged in series to form solar strings). In certain embodiments, the solar panels 202 are connected in parallel to a DC bus 204 and in electrical communication with a plurality of inverters 206. It is understood that any number of the solar panels 202 and the inverters 206 can be used. It is further understood that any electrical configuration can be used. As a non-limiting example, the solar panels 202 and the inverters 206 are arranged in a configuration similar to the configuration of the system 10 or the system 100.

The inverters 206 are electrically coupled to the solar panels 202 to receive a DC current (input) and convert the DC current into an output AC current. As a non-limiting example, at least one of the inverters 206 includes a maximum power point tracker (MPPT) 207 to track a maximum power point of at least one of the solar panels 202. It is understood that the MPPT 207 can be any type of control circuit or logic to search for a maximum power point and allow the at least one of the inverters 206 to extract the maximum power available from an associated device (i.e. any number of the solar panels 202).

As shown a circuit 208 is interposed between at least one of the solar panels 202 and at least one of the inverters 206. As a non-limiting example, the circuit 208 includes a disconnect box (not shown) similar to the disconnect box 34 of the system 10. As a further non-limiting example, the circuit 208 includes a clamping circuit (not shown) similar to one of the clamping circuits 36a, 36b, 36c of the system 10. It is understood that any number of the circuits 208 can be used.

The inverters 206 are utilized on an as-needed basis to convert the DC input and transmit an output power. In certain embodiments, any number of the inverters 206 are selectively toggled between an active state and an inactive state by a controller 209 (e.g. programmable logic controller (PLC)).

As shown, the grid tie system 200 further includes at least one transformer 210 coupled to an output of each of the inverters 206. As a non-limiting example, the transformer 210 is a delta-wye isolation transformer having a plurality of electrically parallel delta primary windings and a wye secondary winding. Each of the delta primary windings is electrically coupled to an AC output of one of the inverters 206 and the secondary winding is electrically coupled to a distribution line. In certain embodiments, the transformer 210 is similar to the utility transformer shown and described in U.S. Provisional Pat. Appl. Ser. No. 61/267,192.

Figure 12A:
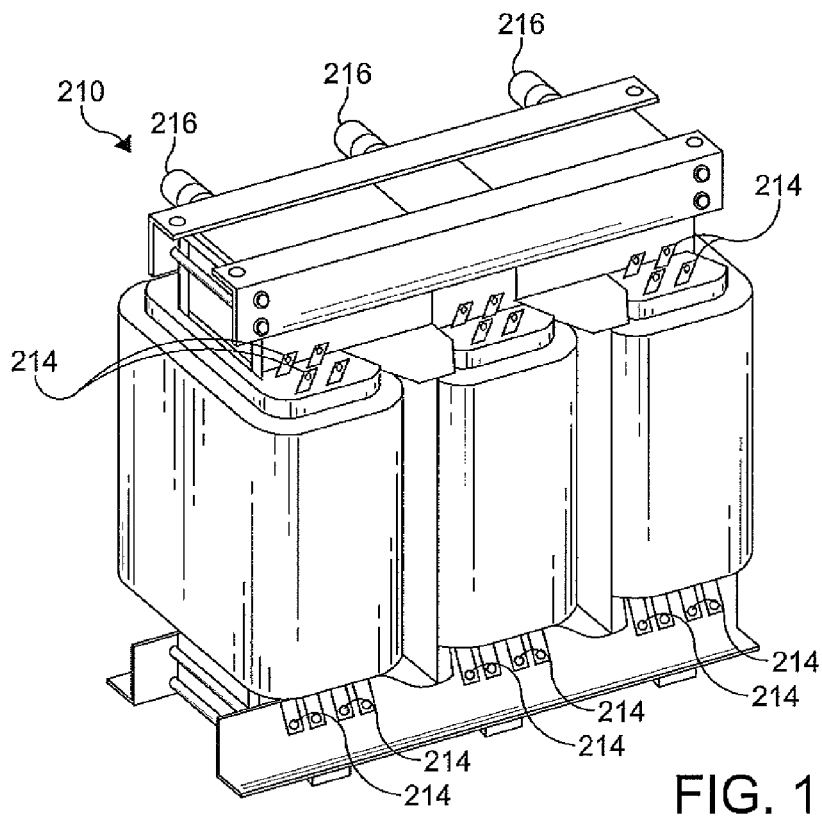
FIG. 12A is a perspective view of a transformer of the grid tie system of FIG. 11.
Figure 12B:
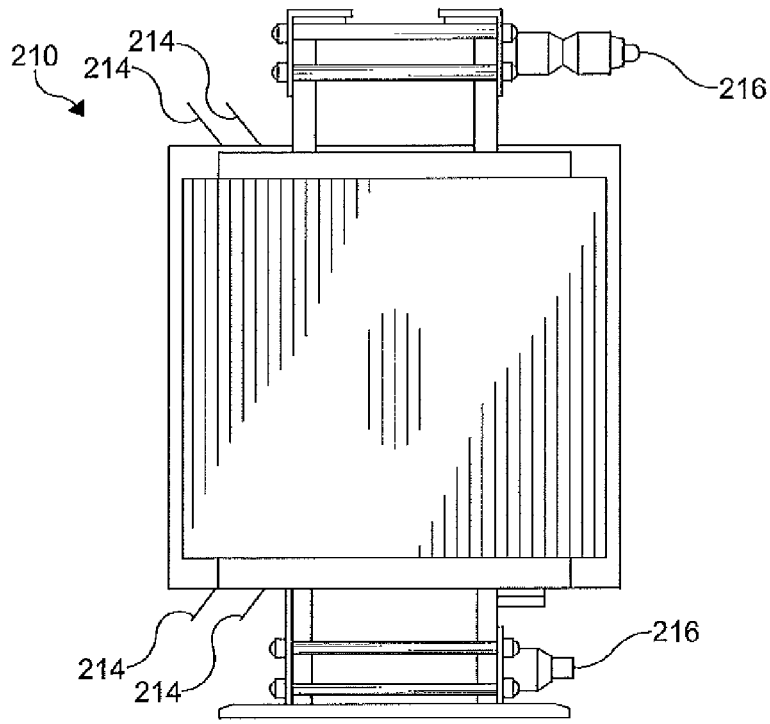
FIG. 12B is a side elevational view of the transformer of FIG. 12A.

FIGS. 12A and 12B illustrate the transformer 210 according to an embodiment of the present invention. As shown, the transformer is a delta-wye isolation transformer having a plurality of electrically parallel delta primary windings and a wye secondary winding. Each of the delta primary windings is electrically coupled to an AC output of one of the inverters 206 via at least one of a plurality of primary connectors 214. The secondary winding is electrically coupled to a distribution line via at least one of a plurality of secondary connectors 216. It is understood that various electrical connections between the inverters, the transformer, and the distribution line to the grid can provide various step-up transformations.

In use, the solar panels 202 generate a DC voltage in response to exposure to solar energy. At least one of the inverters 206 senses the presence of the generated DC voltage and draws an electrical current which causes the DC voltage of at least one of the solar panels 202 to drop. On a pre-determined timeline (e.g. every two seconds) the at least one inverter 206 executes a "perturb and observe" routine to locate a maximum power point of the solar panels 202. It is understood that the perturb and observe routine may include varying a voltage and measuring a change in a resultant current. It is further understood that any perturb and observe routine or algorithm can be used. Once the maximum power point is determined, the at least one of the inverters 206 "locks" onto the maximum power point by maintaining the voltage-to-current ratio, conventionally referred to as maximum power point tracking.

In certain embodiments, the inverters 206 are toggled from an inactive state to an active state on an "as needed" basis in response to a pre-determined and variable power level. Ideally, only one of the inverters 206 manages the maximum power point for the entire system 200, as described above. The controller 209 selectively toggles one of the inverters 206 (referred to as a master inverter 212) into an active state. As a non-limiting example, each of the inverters 206 includes an embedded component (e.g. control circuit) in communication with the controller 209 to transmit a feedback signal to the controller 209 having information relating to an operating characteristic or history of an associated one of the inverters 206. As a further example, the feedback signal includes information relating to: an inverter "time online"; an inverter mode (controllable from the controller 209: maximum power point tracking mode or a specific current output); a current out reading; a DC voltage In reading; an AC voltage in reading; an error/faults experienced by the inverter; a power produced year to date; and a power produced (by month, day, hour, minute, etc.). It is understood that in order to establish a hierarchy of the selection of the inverters 14, the controller 209 queries each of the inverters 206, receives a feedback signal therefrom, and analyzes the information represented by the feedback signal to select a master inverter from the queried inverters 206. Typically, the controller 209 is pre-programmed to select the one of the inverters 206 having the lowest "time online". However, the controller 209 can be programmed to select the master inverter 212 based upon any parameters or analysis.

Once selected, the master inverter 212 is the one of the inverters 206 that manages the maximum power point for the system 200 for a pre-determined time period. When additional ones of the inverters 206 (referred to as non-master inverters 213) are toggled into an active state, the additional non-master inverters 213 draw current; however, the master inverter 212 continues to track the maximum power point of the solar panels 202.

As a non-limiting example, the master inverter 212 that is managing the maximum power point (MPP) is capable of running to a limit of 150 KVA at (240 A). The master inverter 212 is driven until approximately 80% of the 240 A limit is reached. At that point the next one of the non-master inverters 213 in the hierarchy (typically determined based upon the query by the controller 209), is toggled to an active state and driven to approximately 80% of an associated current limit (240 A). It is understood that any percentage of the current or power limit can be used as a threshold value. Simultaneously, the master inverter 212 is adjusted to approximately 20% of the 240 A limit to maintain management of the MPP. The master inverter 212 continues to track the maximum power point until again the master inverter 212 is driven to approximately 80% of the 240 A limit. At that point, the next one of the non-master inverters 213 in the hierarchy is toggled to an active state and driven to approximately 80% of an associated limit. The master inverter 212 continues to manage the MPP, while the active non-master inverters 213 cooperate with the master inverter 212 to manage or "digest" the available current. As the master inverter 212 reaches approximately 80% of the current limit, one of the active non-master inverters 213 (e.g. the second one of the inverters 206 to be activated) is driven to nearly 100% of the current limit, the MPP is monitored, and the level of the master inverter 212 is modified by changing an output of at least one of the non-master inverters 213. It is understood that on a day with intermittent cloud cover, the solar power will vary throughout the day. Accordingly, a time constant or threshold is introduced to eliminate excessive toggling and switching of the inverters 206.

The "active" inverters 206 are adjusted to receive a DC current, convert the DC current to an output AC current, and transmit the AC current to the transformer 210. The transformer 210 combines two functions into one package. The primary function of the transformer 210 is to provide galvanic isolation and voltage step-up (from a nominal 360 VAC to the distribution voltage, typically 12,500 VAC) for the received output of the inverters 210. The secondary function of the transformer 210 is to provide separate impedance balanced primary windings for each of the inverters 206.

The grid tie system 200 including the controller 209 effectively "rotates" the inverters 206 to maintain nearly equal running hours between each of the inverters 206 in the system 200. Accordingly, the grid tie system 200 and method of controlling the system 200: maximizes a harvest of energy under low light level conditions; maximizes a reliability by selectively toggling each of the inverters 206 on an "as-needed" basis; and re-routes power in the event of a failure of one of the inverters 206.

In the fields of electrical generation and distribution, where exposure to 600 V or greater are regulated by the NESC, and in countries where facilities may exceed the 600 V limit (for example, 1000 VDC), the eight or ten solar panels being wired in series provide approximately 30% higher voltage than conventional grid tie solar systems, which translates into higher efficiencies with lower gage wire sizes (i.e., at least one AWG copper wire size less than that required for the conventional six series wired panel string). Also, the capacities of other conductor items are comparably lower/smaller since they are required to handle only a lower current (i.e., lower cost of system materials and lower electrical losses experienced), thereby resulting in approximately the same AC power output (e.g., 1 MW, 250 KW, 125 KW, etc) from the system 10, 100, 200, where generally a solar array is provided to produce a set amount of power in accordance with Ohm's Law ($P=I \times V$).

In the present invention, since the inverters 22, 112, 206 may be switched on and off on an as-needed basis, the accumulated runtime of each inverter 22, 112, 206 is greatly reduced. For example, in an area like Toledo, Ohio, which has an abundance of overcast and partially cloudy weather, each inverter 22, 112, 206 of the present invention may only be utilized for 7.5 years of the 20 year life span of a solar array, as opposed to the life span of inverters of a conventional solar array which are typically on continuously throughout the life of a conventional solar array. Also, in the present invention, if an inverter 22, 112, 206 fails, the remaining inverters 22, 112, 206 will pick up the output current. In the conventional solar array, if an inverter is defective, it must be replaced in order to collect the output current from the rows that are wired to that particular inverter.

It is also known that, in general, inverters are most efficient when they are running at or near their peak power rating. For a conventional solar array, where an inverter is only operating at 10% of rated power, the inverter may only be 85% efficient. In the present invention, the inverters 22, 112, 206 that would currently be turned on would consistently deliver energy at or greater than 96% efficiency.

Operating the inverters 22, 112, 206 on an as-needed-basis lowers costs and results in improving the inverter efficiency rates, for example, the inverters can be taken off-line at night. Also, interstage and inter-inverter transformers are not disposed with the inverters 22, 112, 206 of the present invention, thus resulting in lowering equipment, installation, and maintenance costs. In short, the present invention results in fewer components within the system 10, 100, 200, which translates into higher power efficiencies.

From the foregoing description, one ordinarily skilled in the art can easily ascertain the essential characteristics of this invention and, without departing from the spirit and scope thereof, make various changes and modifications to the invention to adapt it to various usages and conditions.

What is claimed is:

1. A grid tie system for a solar array including a plurality of solar panel strings, each of the solar panel strings including a plurality of solar panels connected in series for generating a DC power output comprising:
   a DC bus for receiving the DC power output from the solar panels;
   a plurality of disconnect boxes spaced along a length of the DC bus, each of the disconnect boxes disposed between the DC bus and an associated one of the solar panel strings to provide selective electrical communication therebetween;
   a plurality of inverters, wherein each of the inverters has an input in electrical communication with the DC bus and an output for converting the DC power output to an AC power output, wherein each of the inverters has an active state and an inactive state and includes a maximum power point tracker to track a maximum power point of at least one of the solar panels, the input of each of the inverters being directly connected to the DC bus by wiring; and
   a controller in communication with the inverters for selectively toggling the inverters between the active state and the inactive state while maintaining at least one of the inverters in the active state to maximize the AC power output and reduce power losses within the grid tie system, the controller responding to the DC power output of the solar panels exceeding a collective capacity of the inverters operating in the active state to toggle another one of the inverters in the inactive state to the active state, the maximum power point tracker of the another one inverter determining a maximum power point for operation of the another one inverter to regulate an operating voltage of the DC bus while all others of the inverters in the active state each operate at an associated maximum current point.

2. The grid tie system according to claim 1, further comprising a clamping circuit disposed between the at least one of the solar panels and the DC bus to limit a voltage across the at least one of the solar panels.

3. The grid tie system according to claim 2, wherein the clamping circuit includes at least one of a double pole, double throw switch and a thyristor to toggle the circuit to a short circuit condition.

4. The grid tie system according to claim 1, further comprising an electrical transformer in communication with an electrical grid and the inverters to receive the AC power output from the inverters and step-up a voltage of the AC power output to match a voltage of the grid.

5. The grid tie system according to claim 4, further comprising an AC bus in electrical communication between an output of each of the inverters and an input of the transformer to transmit the AC power output from the inverters to the transformer.

6. The grid tie system according to claim 1, wherein the inverters execute a "perturb and observe" routine to track the maximum power point of the at least one of the solar panels.

7. The grid tie system according to claim 1, wherein the inverters transmit a feedback signal to the controller, the feedback signal representing an operational characteristic of the inverters, and wherein the controller toggles the inverters between the active state and the inactive state based upon an analysis of the feedback signal.

8. A grid tie system comprising:
   a solar array including a plurality of panel strings in parallel electrical communication with each other, wherein each of the panel strings includes a plurality of solar panels connected in series;
   a direct current bus in electrical communication with each of the panel strings for receiving a direct current power output from the solar panels;
   a plurality of disconnect boxes spaced along a length of the direct current bus, each of the disconnect boxes disposed between the direct current bus and an associated one of the panel strings to provide selective electrical communication therebetween;
   a plurality of inverters each with an input in electrical communication with the direct current bus to receive the direct current power output generated by the solar array and to convert the direct current power output to an alternating current power output, wherein each of the inverters has an active state and an inactive state and includes a maximum power point tracker that tracks a maximum power point of at least one of the solar panels, the input of each one of the inverters being directly connected to the DC bus by wiring; and
   a controller in communication with each of the inverters to receive a feedback signal from each of the inverters and to toggle the inverters between the active state and the inactive state while maintaining at least one of the inverters in the active state based upon an analysis of each of the feedback signals, wherein each of the feedback signals includes information about an operational characteristic of an associated one of the inverters, the controller responding to the direct current power output of the solar panels exceeding a collective capacity of the inverters operating in the active state to toggle another one of the inverters in the inactive state to the active state, the maximum power point tracker of the another one inverter determining a maximum power point for operation of the another one inverter to regulate an operating voltage of the direct current bus while all others of the inverters in the active state each operate at an associated maximum current point.

9. The grid tie system according to claim 8, further comprising a clamping circuit disposed between the direct current bus and at least one of the panel strings to limit a voltage generated by the at least one of the panel strings.

10. The grid tie system according to claim 8, further comprising an electrical transformer in communication with an electrical grid and the inverters to receive the alternating current power output from inverters and step-up a voltage of the alternating current power output to match a voltage of the grid.

11. The grid tie system according to claim 10, wherein the transformer includes a separate impedance balanced primary winding for each of the inverters.

12. The grid tie system according to claim 8, wherein at least one of the inverters executes a "perturb and observe" routine to locate a maximum power point of at least one of the solar panels.

13. The grid tie system according to claim 8, wherein the direct current bus is generally ring shaped.

14. A method of controlling a grid tie system, the method comprising the steps of:

providing a plurality of solar panels connected to a DC bus and generating a DC power output from the solar panels to the DC bus, the solar panels being connected in series in a plurality solar panel strings;

providing a plurality of disconnect boxes spaced along a length of the DC bus, each of the disconnect boxes disposed between the DC bus and an associated one of the solar panel strings to provide selective electrical communication therebetween;

providing a plurality of inverters, each of the inverters being in electrical communication with the DC bus to receive the DC power output and to convert the DC power output to an AC power output, wherein each of the inverters has an active state and an inactive state and includes a maximum power point tracker that tracks a maximum power point of at least one of the solar panels, an input of each of the inverters being directly connected to the DC bus by wiring;

generating a feedback signal including information about an operational characteristic of the inverters;

analyzing the feedback signal; and toggling the inverters between the active state and the inactive state in response to the analysis of the feedback signal while at least one of the inverters is in the active state, the controller responding to the DC power output of the solar panels exceeding a collective capacity of the inverters operating in the active state to toggle another one of the inverters in the inactive state to the active state, the maximum power point tracker of the another one inverter determining a maximum power point for operation of the another one inverter to regulate an operating voltage of the DC bus while all others of the inverters in the active state each operate at an associated maximum current point.

15. The method according to claim 14, further comprising the step of providing an AC bus in electrical communication with each of the inverters to receive the AC power output.

16. The method according to claim 14, further comprising the step of transforming the AC power output to match a voltage of an electrical grid.

17. The method according to claim 14, wherein at least one of the inverters executes a "perturb and observe" routine to locate a maximum power point of at least one of the solar panels.

* * * * *